(12) United States Patent
Colver et al.

(10) Patent No.: US 6,293,828 B1
(45) Date of Patent: Sep. 25, 2001

(54) METHODS AND SYSTEMS FOR A POWER SUPPLY HOUSING

(75) Inventors: Frank W. Colver, Costa Mesa; Trung M. Duong, Garden Grove, both of CA (US)

(73) Assignee: Power-One, Inc., Camarillo, CA (US)

( * ) Notice: Subject to any disclaimer, the term of this patent is extended or adjusted under 35 U.S.C. 154(b) by 0 days.

(21) Appl. No.: 09/257,808

(22) Filed: Feb. 25, 1999

(51) Int. Cl.[7] ................................................... H01K 13/64
(52) U.S. Cl. ........................................... 439/680; 439/76.1
(58) Field of Search .................................... 439/680, 681, 439/76.1, 924.1, 79; 361/686, 724, 725, 726, 727, 728

(56) References Cited

U.S. PATENT DOCUMENTS

| | | |
|---|---|---|
| D. 264,960 | 6/1982 | Secrest . |
| D. 334,561 | 4/1993 | Crater et al. . |
| D. 387,031 | 12/1997 | Tracewell et al. . |
| D. 387,032 | 12/1997 | Tracewell . |
| 2,922,081 * | 1/1960 | Dubin ................................. 361/725 |
| 3,447,036 | 5/1969 | Dore et al. . |
| 4,012,672 | 3/1977 | Douglass et al. .................. 361/422 |
| 4,058,759 | 11/1977 | Halfhill . |
| 4,131,934 | 12/1978 | Becker et al. . |
| 4,595,871 | 6/1986 | Ball . |
| 4,963,098 | 10/1990 | Myer et al. . |
| 5,268,592 * | 12/1993 | Ballamy et al. ...................... 307/43 |
| 5,311,397 * | 5/1994 | Harshberger et al. .............. 361/683 |
| 5,385,481 | 1/1995 | Kotyuk . |
| 5,612,854 * | 3/1997 | Wiscombe et al. .................. 361/727 |
| 5,622,511 | 4/1997 | Jarrett . |
| 5,642,264 | 6/1997 | Cantrell .............................. 361/802 |
| 5,761,045 * | 6/1998 | Olson et al. ........................ 361/726 |
| 5,901,057 | 5/1999 | Brand et al. . |
| 5,909,065 * | 6/1999 | Jones et al. ......................... 307/147 |
| 5,991,163 | 11/1999 | Marconi et al. .................... 361/788 |
| 5,993,241 * | 11/1999 | Olson et al. ........................ 439/378 |
| 5,995,377 | 11/1999 | Tusler et al. ....................... 361/796 |
| 6,006,298 * | 12/1999 | Satoh ................................. 710/103 |
| 6,075,698 | 6/2000 | Hogan et al. ....................... 361/695 |
| 6,175,503 | 1/2001 | Hogan et al. ....................... 361/733 |

\* cited by examiner

*Primary Examiner*—Gary Paumen
*Assistant Examiner*—Ross Gushi
(74) *Attorney, Agent, or Firm*—Knobbe, Martens, Olson & Bear, LLP (57) ABSTRACT

The present invention is directed to methods and systems for a power supply housing system. In one embodiment, the housing assembly has a rear side and at least a first connector accessible from the rear side. The first connector has at least one pin which extends from the rear side by a first amount. A first key assembly extends from the rear side and is configured to permit the power supply to be fully inserted into a rack in a first orientation and to prevent the power supply from being fully inserted into the rack in a second orientation. A standoff assembly extends from the rear side by a second amount greater than the first amount.

23 Claims, 6 Drawing Sheets

METHODS AND SYSTEMS FOR A POWER SUPPLY HOUSING

FIELD OF THE INVENTION

The present invention relates generally to power supplies, and more particularly to power supply housings.

DESCRIPTION OF THE RELATED ART

Mission critical systems, where even a temporary system shutdown is highly undesirable, play an increasingly important role in many essential industries. For example, mission critical systems are often used in the telecommunications industry, in hospitals, and in banking. To avoid system shutdowns, mission critical systems require highly reliable, redundant subsystems, such as redundant power supplies. In addition, many applications, such as telecommunication transmitters, require large amounts of power which may be provided by multiple power supplies.

The need for redundant power supplies capable of supplying large amounts of power has resulted in a corresponding increase in the use of hot-swap power supply technology. A hot-swappable power supply provides the ability to remove and replace the power supply from a power supply rack without turning off power to the rack. Thus, for example, in a power supply rack containing multiple or redundant removable power supply modules, should one module fail, the failed module can be replaced without interrupting the operation of other power supply modules. These racks of multiple power supplies may be used in high-power applications wherein the power supply outputs are ganged together. For example, the telecom industry has applications requiring up to 20,000 watts or more. This power may be provided by one or more racks, each containing multiple hot swappable power supplies ganged together.

However, the use of hot swappable power supplies poses many problems. For example, the removal of a power supply from a rack while power is still applied to the rack may result in arcing between the power supply connector pins and the corresponding rack connector sockets. Such arcing can severely injure an operator and may damage the power supply and the rack.

Furthermore, during a "hot" insertion, the power supply input and output signals may be connected to the corresponding rack signals in an unsafe order. For example, power supply input power pins may contact corresponding rack power pins before the power supply ground pin comes in contact with a corresponding rack ground pin. This can result in a potentially dangerous "floating" condition, where the power supply is operational, but not grounded.

In addition, conventional hot-swappable power supply connectors are particularly susceptible to damage resulting from the frequent handling of the removable supplies. For example, power supply connectors are often damaged as a result of service personnel resting the supply on its connectors while placing the supply on the ground.

Furthermore, the sliding action itself during removal of the power supply from the rack often causes abrasion and gouges on the bottom of the power supply or damages to the rack. Conventional attempts to solve this problem typically utilize plastic guides, or the like, mounted in the rack to guide the power supply as it is being pulled in or out. However, these guides are relatively expensive, and often become damaged themselves during the removal or insertion process.

SUMMARY OF THE INVENTION

The present invention is generally related to a robust, safe, and sturdy power supply systems, which may include one or more power supplies and a corresponding rack. In one embodiment, the power supply is a hot swappable supply with a suitable housing. That is, a power supply and associated housing which can be removed from or inserted into the rack while power to the rack connectors is still on.

In one embodiment, the power supply has an overall rectangular shape. In order to ensure that the power supply is properly oriented while being inserted into a rack, a keying system is provided on a first side, such as the rear of the power supply housing. In one embodiment, the keying is provided by one or more pins, posts, or the like, projecting from a connector-side of the power supply. For example, one or more key pins, which can also act as guide pins or posts, may extend rearward from one or more rear connectors. In one embodiment, these key pins or posts fit into corresponding receptacles on the rack side connectors. Thus, if the user attempts to insert the power supply upside down or sideways, the key pins will strike into a portion of the rack chassis before the power supply connectors and corresponding rack connectors can come into direct contact. Furthermore, in one embodiment, the keys are located so that if the power supply is inserted in an incorrect orientation, the keys will not strike the rack connectors. Thus, connector damage resulting from the improper insertion of the power supply into the rack is greatly reduced.

In addition, in one embodiment, standoff posts or the like are provided extending rearward from the supply. The standoffs advantageously extend past the connector pins or other sets of signal, power or key pins, so that if the power supply is rested on the ground, connector-side down, the power supply will rest on the standoffs, rather than the connector pins. Thus, the standoffs protect the connectors and connector pins from the type of damage that often results when a conventional power supply is rested on its connectors.

In one embodiment, the connectors on the rear of the power supply include at least an AC input connector, a DC output connector, and a control signal connector. In one embodiment, the AC connector is configured to receive single-phase AC power. In another embodiment, the AC connector is configured to receive three-phase AC power. In one embodiment, at least two AC connector pins are relatively staggered, thereby ensuring the safety of the system when the power supply is removed or inserted into the rack.

Thus, for example, in the case of a power supply which has a connector configured to receive single phase AC power, a common pin, a first polarity line pin, a second polarity line pin, and a precharge pin are provided. In one embodiment, the common pin extends the furthest out, thereby ensuring that when the power supply is inserted into the rack, the first connection made will couple the power supply common pin to a rack common point. In another embodiment, a first polarity pin and a precharge pin are shorter in length than the common pin. Thus, when the power supply is inserted into the rack, after the common connection is made, the first polarity line pin and the precharge pin will be connected to corresponding rack connections. This staggered arrangement ensures that a power supply internal EMI filter is charged before the second polarity line is connected. Thus, inrush current, which could cause arcing and pin damage, is thereby reduced. In addition, the second polarity pin is advantageously shorter than the first polarity pin. Thus, the complete AC connection will only be made after the common, the first polarity, and the precharge connections are made. In one embodiment, the control signal connector may have pins similarly staggered to ensure the safe turn-on and turn-off of the power supply.

In another embodiment, the power supply includes a handle extending from the front of the power supply. The handle allows a user to easily grasp the power supply during removal or insertion of the power supply, as well as when carrying the power supply. In one embodiment, the handle is shaped to accommodate a user's fingers. The handle may have a slot through which fingers can protrude slightly to enhance the grasping action.

In another embodiment, a latch is provided to latch the power supply into a correspond slot on the rack. In one embodiment, the latch is accessible from the front side of the power supply. In another embodiment, the latch includes a finger portion. In one embodiment, the finger portion is configured to be kicked out of the way if it is extended while the supply is being inserted into a rack. Thus, damage to the latch is prevented.

In addition, in the one embodiment, user accessible test points are provided. In one embodiment, the test points are provided on the front of the supply and may be used to test various aspects of the power supply. Thus, a test point may be provided to test the power supply output voltage. Furthermore, the front panel may contain test points to test internal power supply operating parameters. In addition, a current test point may be provided.

Furthermore, one or more indicator lights may be provided to visually indicate the current supply operating status. For example, an AC input status light may be provided. Similarly, a DC output status light may also be provided. In addition, a current meter in the form of a bar graph may be provided as well.

In addition, access openings may be provided on one or more sides of the power supply to provide access to internal adjustment circuits. For example, holes may be placed above internally mounted trim pots or switches. The switches or trim pots may be located on internal circuit boards. These trim pots may be used to adjust such parameters as constant current settings, current monitor settings, and/or current limit settings for one or more circuits such as inverters.

In one embodiment, one or more sides of the power supply have openings which allow airflow through the power supply for cooling purposes. Thus, in one embodiment, the rear side and the front side of the power supply have openings across a large part of their surfaces. In another embodiment, a majority of the front side and backside areas is used to provide airflow openings. In one embodiment, an internal fan draws air through the openings on a first side of the power supply and exhausts the resulting heated air through a second side of the power supply.

In one embodiment, when a connector-side of the power supply housing is used to both support connectors, as well as to provide a perforated surface through which air can pass, the connector-side panel is made of a strong material, such as steel, stainless steel, or heavy-gauge aluminum. Thus, the connector side panel is made strong enough to support connectors, as well as the weight of the power supply resting on standoffs, while having sufficient openings for the airflow. In one embodiment, the rear-panel may be plated steel, such as zinc, chrome, or nickel-plated steel, or alternatively, the steel may be stainless steel. One or more sides of the power supply may be painted or powder coated to provide a pleasant appearance, as well as to reduce scratching of the power supply.

In one embodiment, at least one side of the power supply has a substantially square shape. In another embodiment, the power supply housing is approximately 5 inches wide and 5 inches high. In still another embodiment, the power supply housing can fit into a receiving rack. In one embodiment, the rack is a standard 19" width rack which can accommodate up to three power supply modules. In another embodiment, the power supply rack is a 23" rack and can receive four of the 5"×5" power supply modules.

In addition, one side of the power supply housing, such as the bottom side, may include one or more mounting assemblies, such as threaded nuts used to receive fasteners, such as screws. Thus, the power supply may be more permanently mounted into the rack if so desired.

In one embodiment, the rack is configured to receive the power supply. Thus, the rack has one or more slots sized to accept the power supply. In addition, the rack may have openings used to mate with the power supply keys and standoffs.

DETAILED DESCRIPTION OF THE PREFERRED EMBODIMENTS

The present invention is generally related to power supplies, and in particular, to removable power supplies. One embodiment of the present invention is advantageously directed to hot-swap power supplies having power supply housing features which facilitate the protection of power supply connectors, the carrying of the power supply, and the insertion and removal of the power supply into a rack.

Figure 1:
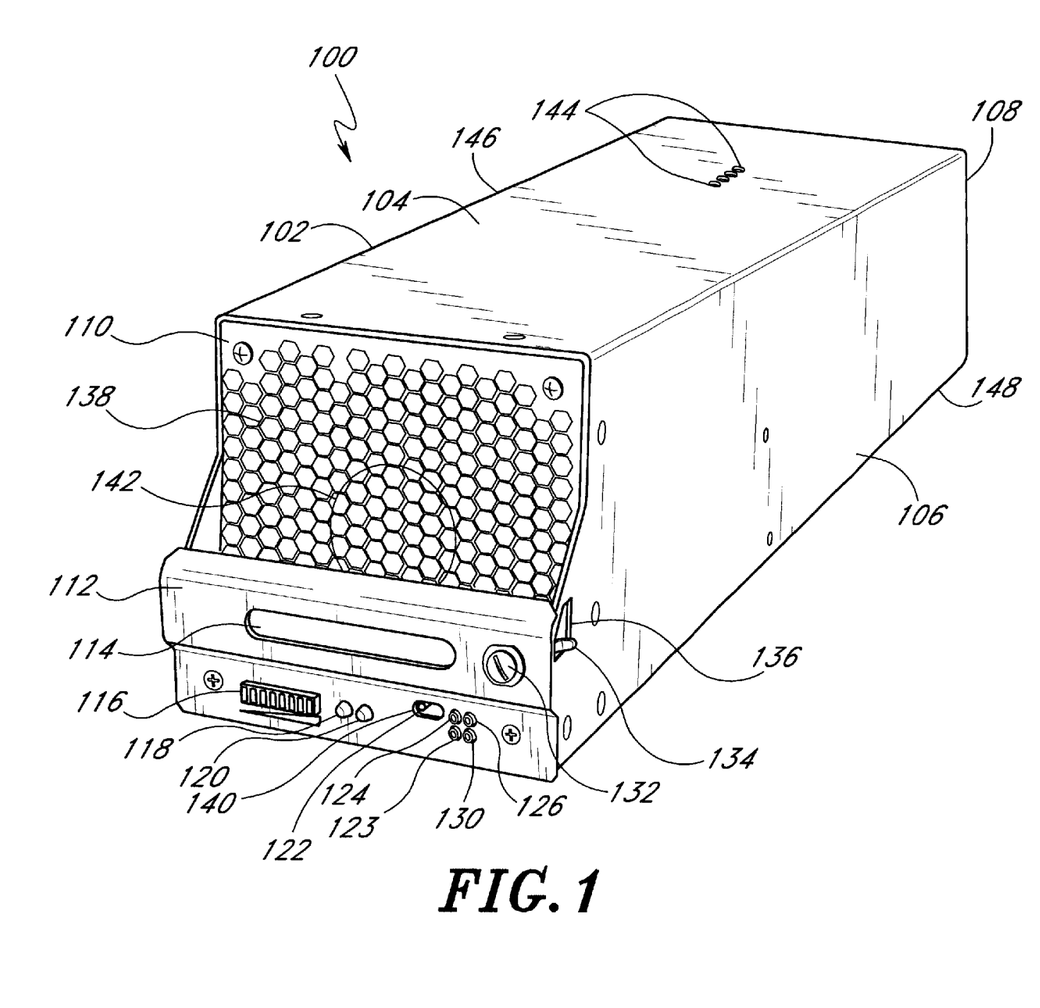
FIG. 1 is an illustration of a top perspective view of one embodiment of the resent invention.

As illustrated in FIG. 1, in one embodiment, a power supply 100 has an attractive housing 102 with a generally rectangular shape. The power supply 100 is designed to be easily carried by service personnel and to be easily and reliably removed or inserted into a rack assembly, such as the rack assembly 800 illustrated in FIG. 8. The illustrated housing 102 has a front side 110, a rear side 108, a topside 104, a bottom side 148, a left side 146, and a right side 106. In one embodiment, the power supply housing 102 has a substantially square front 110 and rear 108, and is approximately 5" wide (excluding a handle 112), 5" high, and 12.25" deep, with tolerances of ±0.25", though other dimensions and tolerances may be used as well. For example, in another embodiment, the power supply housing is approximately 7" wide, 7" high, and 10" deep. In the illustrated embodiment, the handle 112 mounted on the front of the power supply is approximately 5.25" wide. As described below, when using the 5" wide dimensioned power supplies, multiple power supplies can be inserted side-by-side into a standard 19" or 23" wide rack.

The exterior of the power supply housing 102 may be painted or powder coated to enhance the power supply's appearance and to reduce scratches and abrasions on the possible housing itself. In one embodiment, the bottom side 148 of the power supply is not powder coated or painted as the insertion and removal process during hot swapping would tend to damage the paint. The many other features of the power supply housing 102 are described in detail below.

The power supply housing 102 may house power supply circuitry (not shown) used to convert an input power, such as single-phase or three-phase AC power, to an output power, such as DC power or AC power having different characteristics, such as a different voltage, than the input power. The electronic circuitry may be mounted on one or more circuit cards (not shown) or to the housing 102 itself. The power supply circuitry may contain transformers, invertors, transistors, operational amplifiers, resistors, capacitors, inductors, electromagnetic interference (EMI) filters, and output diodes for wire-ORing the power supply output with other outputs of other power supplies.

Figure 3:
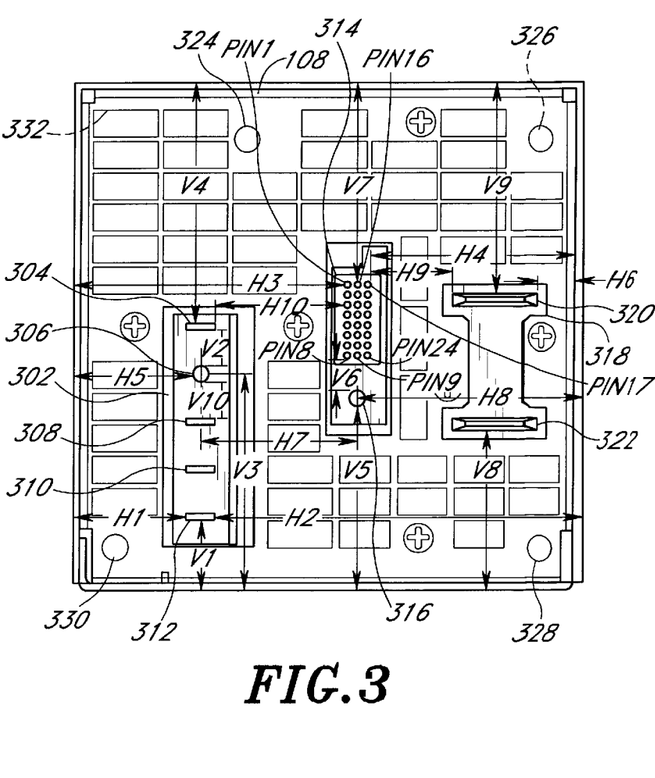
FIG. 3 is a rear view of one embodiment of the housing illustrated in FIG. 1.

As illustrated in FIG. 3, in one embodiment, the rear 108 of the power supply housing 102 includes multiple connectors 302, 314, 318. As described below, the illustrated arrangement of the connectors 302, 314, 318 enhances the power supply's ability to be hot-swapped, and is ornamental as well. However, other arrangements may be used as well. For example, the relative positions of the connectors 302, 318 may be swapped. In another embodiment, the connectors may be positioned on other sides of the power supply, such as the top 104 or the bottom 148. The connectors may be mounted to circuit boards located within the housing 102, as well as, or instead of, to the housing 102 itself. In addition, the connectors 302, 314, 318 may have one or more pins or terminals electrically connected to one or more circuit boards.

For purposes of the following discussion, the terms left or left-most and right or right-most are used from the perspective of the front of the power supply 100. In the illustrated embodiment, the right-most connector 302 is used to receive AC power. In one embodiment, the input voltage is nominally 230 volts, although in other embodiments, this voltage can be higher or lower. In the illustrated example, input terminals or pins 304, 308, 310, 312 are sized to conduct at least 16 amps at 230 volts. In one embodiment, the spacing between pin 308 and pin 310 is approximately 0.5", as is the spacing between pin 310 and pin 312.

Figure 8:
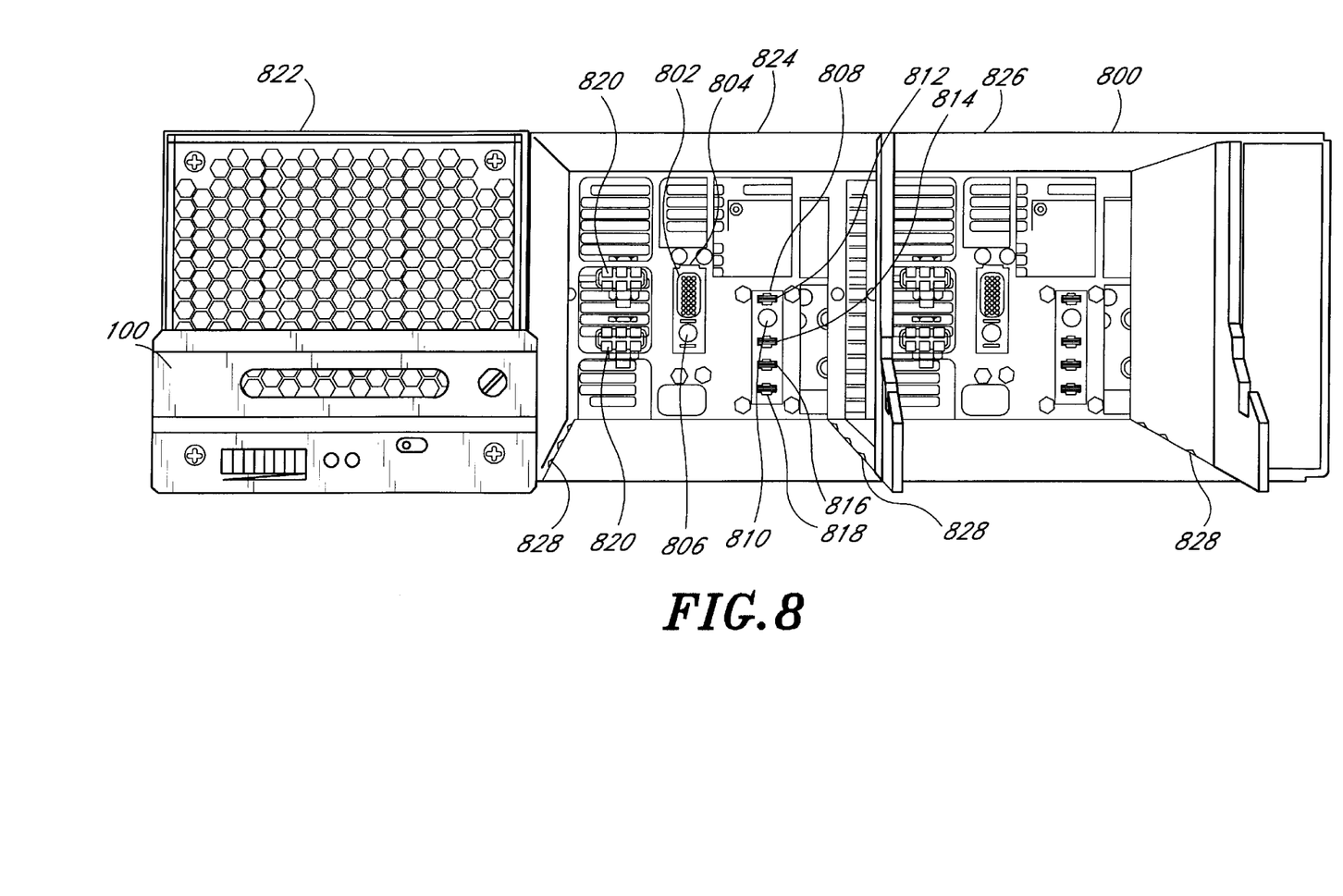
FIG. 8 is an illustration of one embodiment of a rack and power supply.

The uppermost pin 304 is used to receive a common or ground input. The input pin 308 is used to receive a first polarity of the AC power, and the input pin 310 is used to receive a pre-charge voltage. The pre-charge voltage is used to pre-charge one or more EMI filters, or the like, located within the power supply housing. Typically, EMI filters and other input circuits include capacitive elements which, upon insertion of the power supply into a rack providing AC power to the supply, will appear to be at a low resistance path to ground. Thus, a high in-rush current will occur as the capacitive elements charge, unless these capacitive elements are pre-charged before both polarities of the input AC power are connected to the corresponding AC input pins 308, 310. A high in-rush current, which could be several times the normal steady-state input current, is undesirable because it may result in overheating and the premature failure of the input pins 308, 310. The bottom-most pin 312 is used to receive a second polarity of the AC input power. As illustrated in FIG. 8, the rack 800 has a corresponding connector 808, with corresponding pins or sockets 812, 814, 816 used to mate with the AC input connector 302 and pins 304, 308, 310, 312.

Figure 5:
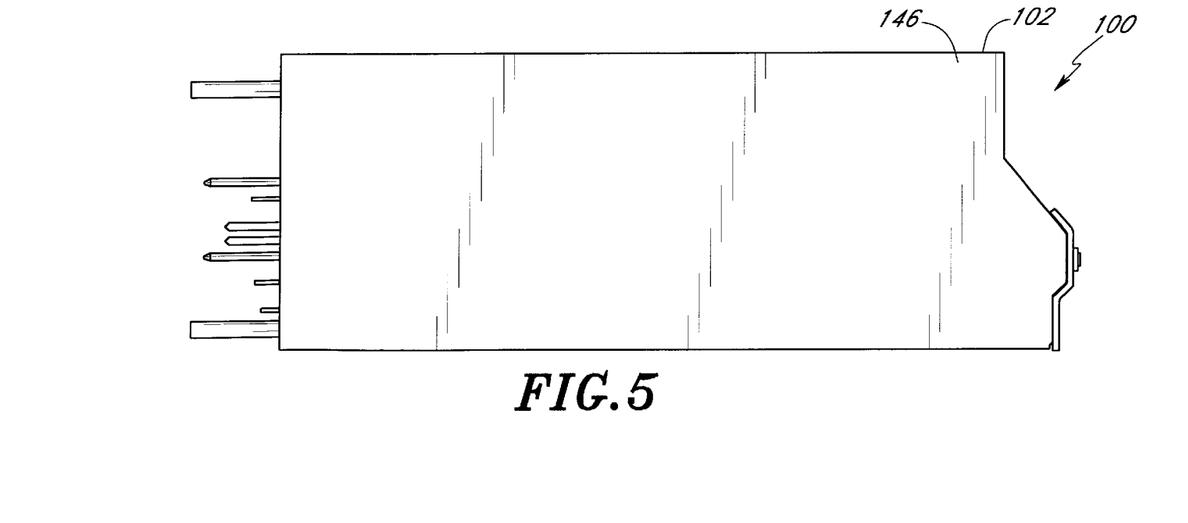
FIG. 5 is an illustration of the left side of the housing illustrated in FIG. 1.

In one embodiment, at least two AC connector pins are staggered, having different lengths, thereby ensuring the safety of the system when the power supply is removed or inserted into the rack. Thus, as illustrated in FIG. 5, for the exemplary input connector 302 described above, having a common pin 304, a first polarity line pin 308, a second polarity line pin 312, and a precharge pin 310, the common pin 304 extends the furthest out. This ensures that when the power supply 100 is inserted into a rack, the first connection made will couple the power supply common pin 304 to a rack common point. Thus, the power supply will be safely grounded before further connections are made. Furthermore, the first polarity pin 308 and the precharge pin 310 are shorter in length than the common pin 304. Thus, when the power supply 100 is inserted into the rack, after the common connection is made, the first polarity line pin 308 and the precharge pin 310 will be connected to corresponding rack connections. This staggered arrangement ensures that the internal power supply EMI filter is charged before the second polarity line is connected, thereby reducing in-rush current. In addition, the second polarity pin 312 is advantageously shorter than the first polarity pin 308. Thus, the complete AC connection will only be made after the common, the first polarity, and the precharge connections are made.

In one embodiment, the AC input connector 302 is spaced sufficiently from the top wall 104, the bottom wall 148, and the side housing walls 106, 146 to ensure the reduction or elimination of arcing between the connector 302 and the housing walls under normal operating conditions. The spacing of the connectors 302, 314, 318 is optionally chosen so as to space the connectors closely and efficiently, while ensuring no arcing between connectors occurs. As illustrated in FIG. 3 and Table 1 below, in one embodiment, the spacings H9, H10 between connectors is no less than approximately 0.80" and no greater than approximately 1.35" in the horizontal direction. In one embodiment, the tolerance of the given dimensions is about ±0.15". In another embodiment, the tolerance of the dimensions is about ±0.25". In one embodiment, the spacing H1 of pin 312 of the AC input connector 302 to the right side of the housing 102 is approximately 1.10". The spacing V1 of pin 312 of the AC input connector 302 to the bottom edge of the housing 102 is approximately 0.75". The spacing V4 of pin 312 of the AC input connector 302 to the top edge of the housing 102 is approximately 2.50".

In addition, in one embodiment, the AC input connector 302 includes a key/guide pin 306. In one embodiment, the key/guide pin 306 is mounted between the common or ground pin 304 and the first AC polarity pin 308. In one embodiment, the spacing V2 of the key/guide pin 306 to pin 304 is approximately 0.35" and the spacing V10 from the key/guide pin 306 to the pin 306 is approximately 0.45". Alternatively, the key pin 306 may be located on the rear panel 108 itself.

In one embodiment, the key/guide pin 306 performs two functions. The key/guide pin 306 keys the power supply 100 to ensure it is not inserted incorrectly into a rack. In addition, in one embodiment, the key/guide pin 306 ensures that the AC input connector 302 is properly guided to mate with a corresponding receiving rack connector 808, as illustrated in FIG. 8, during insertion of the power supply 100 into the rack 800. As discussed below, multiple keys may be provided. The keys are preferably spaced and arranged so that the power supply 100 can only be fully inserted in the correct orientation. Thus, for example, in one embodiment at least one of the keys is offset from the center or the centerline of the rear 108 of the supply 100. This helps ensure that the power supply connectors 302, 314, 318 will be offset relative to corresponding rack connectors 808, 804, 820 when the supply is incorrectly oriented, thus preventing the mating of connectors. The pin assignments, relative dimensions, spacing and placement of the rack connectors 808, 804, 820, associated mating terminals, and key mates are substantially the same as the corresponding power supply connectors 302, 314, 318, connector terminals, and keys.

Furthermore, in one embodiment, the keys are located so that if the power supply 100 is incorrectly orientated while being inserted into the rack, the keys will not strike the rack connectors, but will instead strike a metal panel or chassis. In one embodiment, the spacing V3 of the key/guide pin 306 from the bottom edge of the housing 102 is approximately 2.12". Thus, in the illustrated embodiment having a power supply housing height of 5", the horizontal centerline is 2.5" from the bottom edge, and the key/guide pin 306 is spaced at least 0.4" inches from the centerline. The rack connector 808 has a socket or bore or other type of receptacle 810 used to receive and guide the key/guide pin 306.

TABLE 1

| Parameter | Dimension (±0.15") |
|---|---|
| V1 | 0.75" |
| V2 | 0.35" |
| V3 | 2.12" |
| V4 | 2.50" |
| V5 | 1.80" |
| V6 | 0.41" |
| V7 | 2.10" |
| V8 | 1.63" |
| V9 | 2.05" |
| V10 | 0.45" |
| H1 | 1.10" |
| H2 | 3.60" |
| H3 | 2.70" |
| H4 | 2.05" |
| H5 | 1.30" |
| H6 | 1.20" |
| H7 | 1.45" |
| H8 | 2.20" |
| H9 | 0.80" |
| H10 | 1.35" |

In one embodiment, the AC input frequency can range from 47 hertz to 63 hertz, although other frequencies, such as 400 Hz, can be used as well. Furthermore, in another embodiment, the same AC input connector can be used in a three-phase input power supply. When used with a three-phase power supply, the top pin 304 is configured to receive a common or ground input, and the following three pins 308, 310, 312 are configured to receive the three phases of the AC power. In one embodiment, the three phase AC connector has either a different key or a different key position than the single phase power supply. Using different keys or key positions for different power supply configurations ensures that a single phase supply is not accidentally inserted into a rack intended for a three phase power supply, and to similarly ensure that a three phase power supply is not inserted into a single phase rack.

The middle connector 314, also termed a control signal connector, receives various control inputs and outputs various power supply signals when plugged into a rack. In one exemplary embodiment, the closet spacing H10 of a control signal connector pin to an AC input connector pin in the horizontal direction is approximately 1.35". Thus, the control signal connector 314 is sufficiently spaced from the AC input connector 302 so as to ensure that minimal electrical interference occurs between the AC power line signals and the control signals passing through the control signal connector 314. In addition, the spacing between connectors is selected to ease the assembly process by providing sufficient room for finger access to screws used to bolt the connectors to the power supply housing 102.

In one embodiment, the control signal connector 314 is a male connector, and the male pins are recessed so as not to protrude past the rear side 108 of the housing 103. As illustrated in FIG. 8, the rack 800 has a connector 804 with a set of pins or sockets 802 used to mate with the control signal connector 314.

In one embodiment, the control signal connector 314 contains at least 24 pins, however, in other embodiments, fewer or greater numbers of pins can be used as well. Table 2 below lists an exemplary listing of the control signal connector pins. The pin assignment is chosen and arranged to reduce electrical interference between signals. For example, the sense signals, −SENSE and +SENSE are provided on pins 16 and 17 respectively, on the top row of the control signal connector 314. Thus, the sense signals are located adjacent to a minimum of other pins.

In addition, redundant pins are provided for certain functions. For example, two internally connected current sharing enable pins, pins 14 and 19, are provided. These current sharing enable pins are used to place multiple rack-mounted supplies on the same bus in a current-sharing mode. Having two internally connected current sharing pins on each rack-mountable power supply allows daisy-chaining of the supplies using only one level of wiring on the corresponding mating rack pins. For example, for a given rack slot, a rack mating pin corresponding to control signal connector pin 14 is connected to a rack mating pin corresponding to pin 19 for a preceding power supply slot. Similarly, for the given slot, the rack mating pin corresponding to control signal connector pin 19 is connected to a rack mating pin corresponding to pin 14 for a following power supply slot.

The control signal connector 314 further includes pins 7, 8, 9 which are used to enable the power supply 100. In one embodiment, the rack mating connector pins corresponding to the control signal connector enable pull-up and enable pins 7, 8 are shorted together using a shorting jumper. Thus, when the power supply 100 is inserted into the rack 800, the enable pull-up pin 7 is electrically connected to the enable pin 8, thereby enabling the operation of the power supply 100. In one embodiment, the enable pull-up pin 7 and the enable pin 8 are shorter than the other control signal connectors pins. Thus, when the power supply 100 is inserted into the rack 800, pins 7 and 8 will make contact with the corresponding rack pins after the other control signal pins have mated. Thus, the power supply 100 will not be enabled until the other control signal pins have mated with the corresponding rack mating connector pins, thereby ensuring the power supply 100 is in a safe state before the supply is turned-on. Similarly, upon removal of the supply 100 from the rack 800, the enable pull-up and enable pins 7, 8 will be disconnected from the mating before the other pins, thereby ensuring the safe turn-off of the supply 100.

Furthermore, in one embodiment, two margin control input signal pins 11, 12 are provided. The margin control input signal pins 11, 12 accept analog voltage inputs which cause the power supply to vary the DC output voltage in accordance with variations in the margin control voltage. The MARGIN 1 signal is typically daisy-chained to pin 11 of each rack-mounted supply. Thus, varying the voltage of pin 11 of the supplies causes the DC output voltage of the supplies to be varied in unison in response. In one embodiment, the MARGIN 1 signal is controlled by a Master Voltage Control. Similarly, The MARGIN 2 signal is typically daisy chained to pin 12 of each rack-mounted supply. Thus, varying the voltage of pin 12 of the supplies also causes the DC output voltage of the supplies to be varied in unison in response. In one embodiment, the MARGIN 2 signal is varied in response to changes in a battery temperature of a battery coupled to the rack.

| Control Signal Connector Pin | Signal |
|---|---|
| 1 | DC OK NORMALLY OPEN |
| 2 | DC OK COMMON |
| 3 | DC OK NORMALLY CLOSED |
| 4 | POWER FAIL PULL-UP |
| 5 | POWER FAIL |
| 6 | POWER FAIL RETURN |
| 7 | ENABLE PULL-UP |
| 8 | ENABLE |
| 9 | ENABLE RETURN |
| 10 | CURRENT MONITOR |
| 11 | MARGIN 1 OUTPUT VOLTAGE ADJUSTMENT |
| 12 | MARGIN 2 OUTPUT VOLTAGE ADJUSTMENT |
| 13 | MARGIN REFERENCE |
| 14 | CURRENT SHARE |
| 15 | 5 V LOGIC POWER |
| 16 | −SENSE |
| 17 | +SENSE |
| 18 | LOGIC COMMON |
| 19 | CURRENT SHARE |
| 20 | CONSTANT CURRENT PROGRAMMING |
| 21 | SPARE |
| 22 | SPARE |
| 23 | SPARE |
| 24 | SPARE |

In one embodiment, one or more pins of the control signal connector 314 are staggered to ensure that the control signal pins are connected in a proper sequence when coupled to the corresponding rack connector 804. For example, pins 9, 14, 23, and 24 may be longer than the other pins of connector 314. In one embodiment, a key/guide pin 316 is located on the connector 314 below or in the pin 316 area. Alternatively, the key/guide pin 316 may be located on the rear panel 108 itself. As illustrated in FIG. 8, the rack 800 has an opening, socket, or bore 806 used to receive and guide the key/guide pin 416. In one embodiment, the key/guide pin 316 may have a different shape, diameter, or key indentations, than other power supply keys. Thus, each key may be optionally "keyed" differently.

In the illustrated embodiment, the spacing V5 of the key/guide pin 316 from the bottom edge of the power supply housing 102 is approximately 1.80". The spacing of the key/guide pin 316 from the left edge of the power supply 102 is approximately 2.2".

The DC output power connector assembly 318 includes two DC output pins or terminals 320, 322, one pin for each DC polarity. The pins or terminals 320, 322 may be part of a single connector, or may be individually mounted to one or more circuit boards located within the housing, as well as, or instead of, to the housing 102 itself. The spacing H6 of the pins 302, 322 from the left edge of the housing 102 is approximately 1.20". The spacing V8 of the pin 322 from the bottom edge of the housing 102 is approximately 1.63" and the spacing of the pin V9 from the top edge of the housing is approximately 2.05". In an exemplary embodiment, the closest horizontal spacing H9 between the control signal connector pins and the DC output power connector pins is spaced approximately 0.8".

In one embodiment, the DC output power pins 320, 322 are comprised of copper coated with nickel or tin. However, other conductive materials may be used as well. In one embodiment, the DC output pins 320, 322 are rated to carry at least 50 amps of output current. However, the DC output connector pins 320, 322 may be able to carry greater or less current as well. For example, the pins 320, 322 in the illustrated embodiment are sized and rated to carry up to 500 amps of current. As illustrated in FIG. 8, the rack 800 has a mating assembly 820 used to mate with the pins 320, 322.

In one embodiment, support structures, such as standoff posts or pins, are positioned on the connector-side of the power supply. In the embodiment illustrated in FIG. 3, standoffs 324, 326, 328, 330 are provided on the rear side 108 of the power supply. These standoffs 324, 326, 328, 330 are positioned to permit the power supply 100 to be placed on the ground, rear side downward, so as to provide balanced support of the power supply 100 without damaging the connectors or connector pins. Thus, in one embodiment, one or more standoffs 324, 326, 328, 330 extend away from the rear of the power supply 100, past the connector pins. Thus, when the power supply 100 is rested on the standoffs, connector pins do not contact the floor, and the connectors and connector pins are protected from damage.

In one embodiment, a first standoff 324 is spaced approximately 1.7" from the right side 106 of the power supply 100, and approximately 0.5" from the top side 104 of the power supply 100. A second standoff 326 is similarly spaced approximately 0.5" from the top 104 of the power supply 100 and approximately 0.5" from the left side 146 of the power supply 100. A third standoff 328 is space approximately 0.4" from the right side 106 of the power supply 100 and approximately 0.4" from the bottom 148 of the power supply 100. A fourth standoff 330 is positioned approximately 0.4" from the left side 146 of the power supply 100 and approximately 0.4" from the bottom 148 of the power supply. In the one embodiment, the posts 324, 326, 328, 330 are welded onto the rear panel 108 of the power supply 100. Furthermore, in one embodiment, the standoffs are made of a strong enough material, such as steel or stainless steel, so as to be able to support the weight of the power supply 100.

In one embodiment, apertures 332 are punched or otherwise formed on the rear side panel 108. The apertures 332 are used to permit airflow through the power supply 100 for cooling purposes. In one embodiment, a majority of the rear side 100 is composed of apertures 332, thereby further enhancing the airflow through the power supply 100. However, some rear panel material may be needed for the mounting of the standoffs, for accepting screws used to mount boards or connectors to the rear panel, as well as for receiving any screws used to assemble the housing 102 itself. In one embodiment, because so much material of the rear panel 108 has been removed, the rear panel 108 is made of a strong material, such as steel, so that even with the little material remaining, the rear panel can support the weight of the power supply 100 resting on the standoff without substantial deformation. Furthermore, the rear-panel 108 may be plated steel, such as zinc, chrome, or nickel-plated steel, or alternatively, the steel may be stainless steel.

Figure 2:
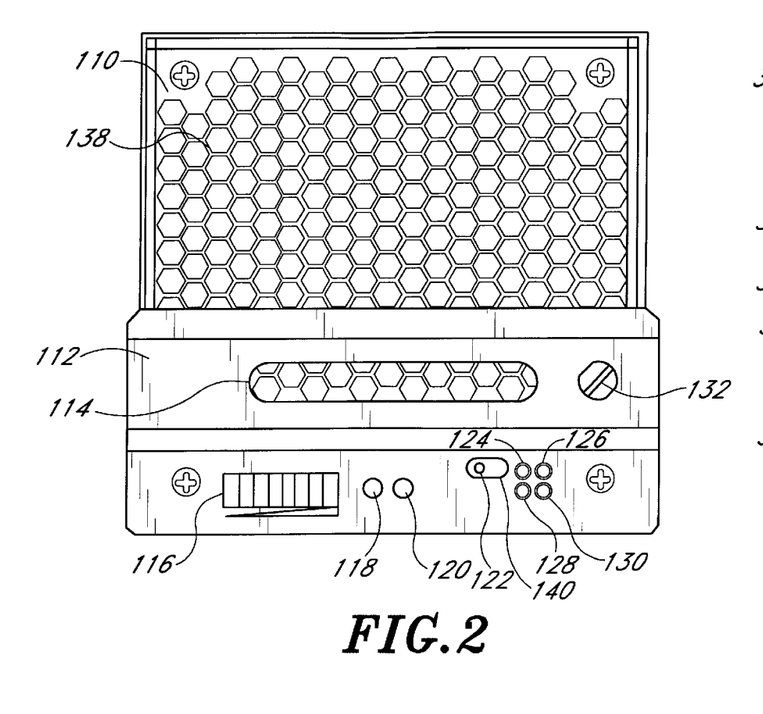
FIG. 2 is a front view of the embodiment illustrated in FIG. 1.

Referring now to FIG. 2, an exemplary front 110 of the power supply 100 is illustrated. In one embodiment, the front of the power supply 100 includes an area with honeycomb-shaped apertures 138 used to allow air to pass through the power supply 100 for cooling. Other aperture shapes, such as circular or square shapes, may be used as well. A fan 142 is optionally mounted within the power supply 100. The fan is used to pull air entering from the front panel apertures 138, through the power supply 100, thereby cooling hot power supply components, and to exhaust the resulting hot air through the rear panel apertures 332.

In one embodiment, the handle 112 is positioned on the front of the power supply 100. The handle 112 may be integrally formed as part of the front panel 110 or may be a separate bolted-on assembly. The handle 112 is shaped to allow a user or operator to comfortably grasp the handle for inserting and removing the power supply 100 from a rack, as well as for carrying the power supply 100 from location to location.

Figure 4:
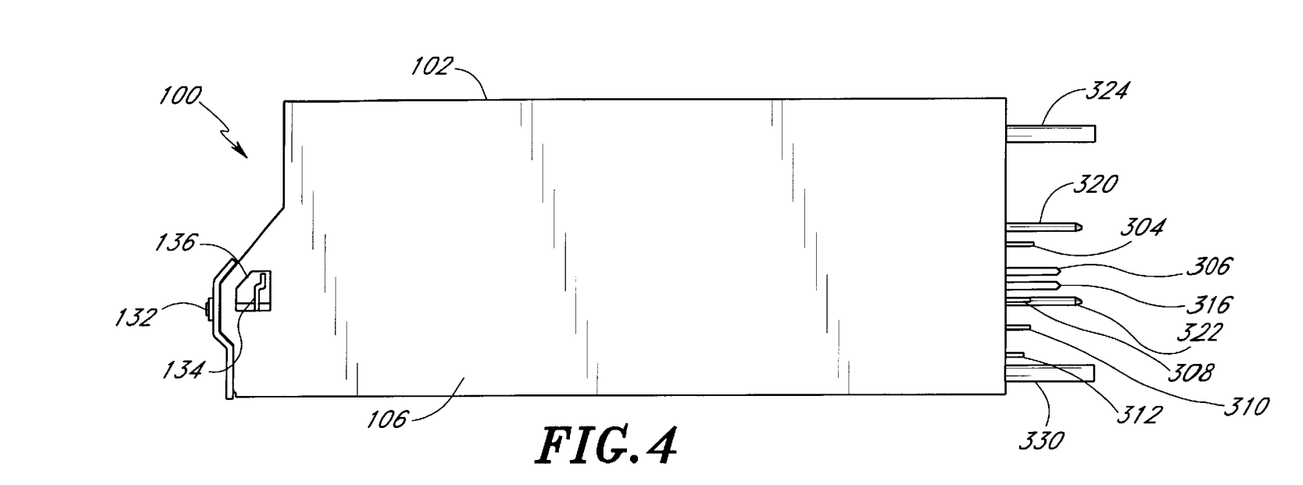
FIG. 4 is an illustration of the right side of the power supply housing illustrated in FIG. 1.

Referring to FIG. 4, the right side 106 of the power supply 100 has a lower sidewall extending forward of the power supply body. As illustrated in FIG. 5, a corresponding forward extending sidewall is provided on the left side 146 of the power supply 100. The handle 112 is mounted across the two sidewalls. The extended portions of the two sidewalls are spaced far enough away from the honeycombed face of the power supply 100 so as to permit an operator's fingers to fit within the space between the handle 112 and the honeycombed face, and thereby grasp the power supply handle 112. In addition, an open area or slot 114 is formed on the front of the handle 112 through which the tips of the operator's fingers may at least slightly protrude when grasping the handle 112. Thus, the open area 114 of the handle 112 provides the user with a more secure grip then conventional power supply handles.

In the one embodiment, the front 110 of the power supply 100 also includes one or more indicators, test points, and/or adjustment points. Thus, as illustrated in FIG. 2, in one embodiment, the front panel 110 includes a bar meter 116 for indicating the amount of output current, a DC output power OK LED 118 indicator, and an input power OK LED indicator 120. Furthermore, test points 124, 126, 128, 130 are provided to monitor the output voltage going to the DC output connector 318, an internal voltage before an output diode (not shown), and the output current. In addition, access is provided to a voltage output adjustment potentiometer 122 via an aperture 140, thereby allowing the user to vary the output voltage within a given range.

In addition, access to a latch mechanism 132 is provided to latch the power supply 100 into a rack. In one embodiment, the latch 132 may be accessed from the front of the power supply 100. In one embodiment, the latch 132 is a pawl latch having a pawl finger 134. In order to latch the power supply 100, the power supply 100 is first inserted into a rack. Using a screwdriver inserted into a slotted latch head accessible on the front of the power supply, the user or operator rotates the latch head. This causes the pawl finger 134 to rotate and to thereby protrude from an opening or aperture 136 on the side of the power supply 100, as illustrated in FIG. 4. As will be discussed in greater detail below, this pawl finger 134 engages a corresponding slot on the rack. Thus, use of the latch ensures the safe and secure installation of the power supply 100. To remove the power supply 100, an operator again inserts a screwdriver into the latch slot and rotates the slotted head counterclockwise, thereby removing the pawl finger 134 from the corresponding slot of the rack. In one embodiment, the pawl finger 134 is spring loaded to provide flexibility in its positioning.

Figure 6:
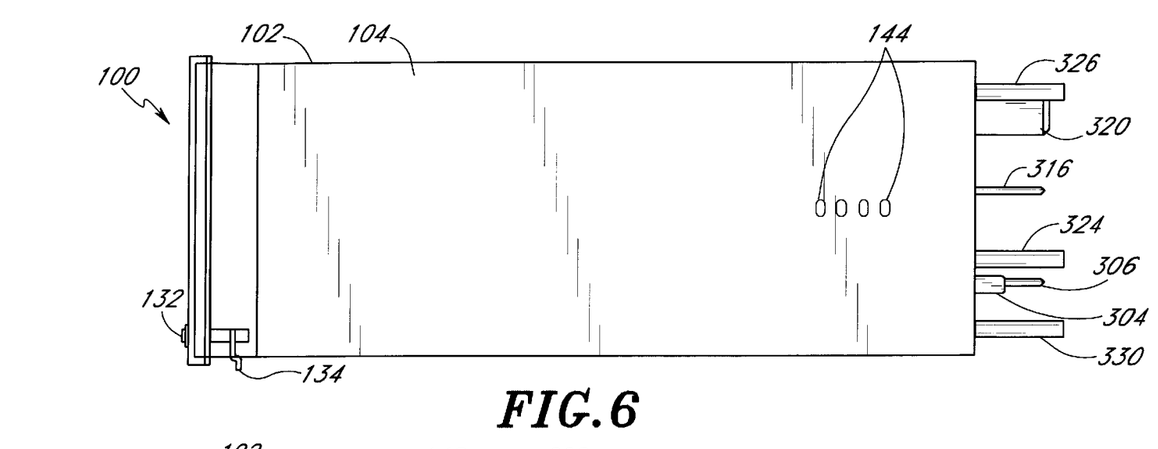
FIG. 6 is a top plan view of one embodiment of the housing illustrated in FIG. 1.

Referring to FIGS. 1 and 6, the illustrated top 146 of the power supply optionally has one or more openings 144 providing access to internal adjustments. Access is thereby provided to internal potentiometers or switches, allowing either factory personnel or the user to control certain internal power supply settings. These settings may include constant current adjustments, current monitor adjustments, and current limiting adjustments for one or more invertors.

Figure 7:
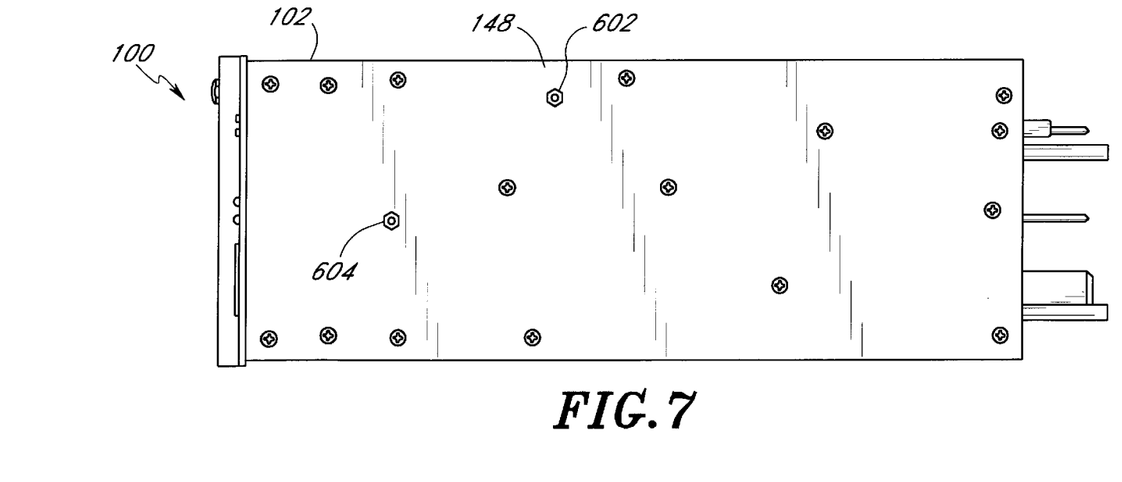
FIG. 7 is an illustration of the bottom side of the housing illustrated in FIG. 1.

As illustrated in FIG. 7, in one embodiment, the bottom side 148 of the power supply 100 has multiple holes for receiving screws. The screws are used to mount internal components, such as circuit boards and the like, or to assemble the housing itself. In addition, the bottom side 148 of the power supply 100 may include one or more threaded nuts 602, 604 or the like for permanent mounting into a rack. These threaded nuts 602, 604 are configured to receive screws which are inserted through the rack chassis and into the threaded nuts 602, 604, thereby securing the power supply 100 to the rack. Other securing techniques, such as dzus fasteners, may be used as well.

In one embodiment, a low friction material (not shown), such as nylon, Formex, Kapton, or Teflon, may be provided on the power supply housing bottom 148 so as to enhance the slideability of the power supply 100 into and out of a rack. In another embodiment, the low friction material may instead by applied to the portion of the rack on which the bottom 148 of the power supply is to slide.

FIG. 8 illustrates one embodiment of the rack 800 used to receive one or more of the power supply described above. On the illustrated embodiment, the rack has three slots 822, 824, 826 used to receive three power supplies side-by-side. The rack 800 has a panel width of 19", allowing the use of a standard 19" rack chassis. In an alternative embodiment, the rack 800 may be sized to accept fewer or more power supplies. For example, the rack 800 may be sized to fit into a 23" rack and to receive up to four power supply modules.

Each rack slot or position 822, 824, 826 has corresponding connectors 808, 804, 820 for receiving the power supply connectors 302, 314, 318. In addition, as discussed above, the rack has appropriate receiving portions for receiving the key/guide pins 306, 316 and for optionally receiving the standoff posts. For example, in the illustrated embodiment, the rack AC connector 808 and the rack control signal connector 804 have corresponding sockets 810, 806 used to receive the power supply keys 306, 316. Thus, if an operator attempts to insert the power supply oriented incorrectly, such as upside down, the key/guide pins 306, 316 will prevent the operator from fully inserting the power supply 100, thereby preventing damage to the supply 100 or the supply connectors 302, 314, 318. In another embodiment, the keys are mounted to the rack instead of the power supply, and the power supply has receiving areas, such as openings, for receiving the keys.

In addition, the rack 800 has metal guide tabs 828 located along the internal bottom portion of the rack, which are spaced so as to guide a power supply properly during insertion or removal.

Figure 9:
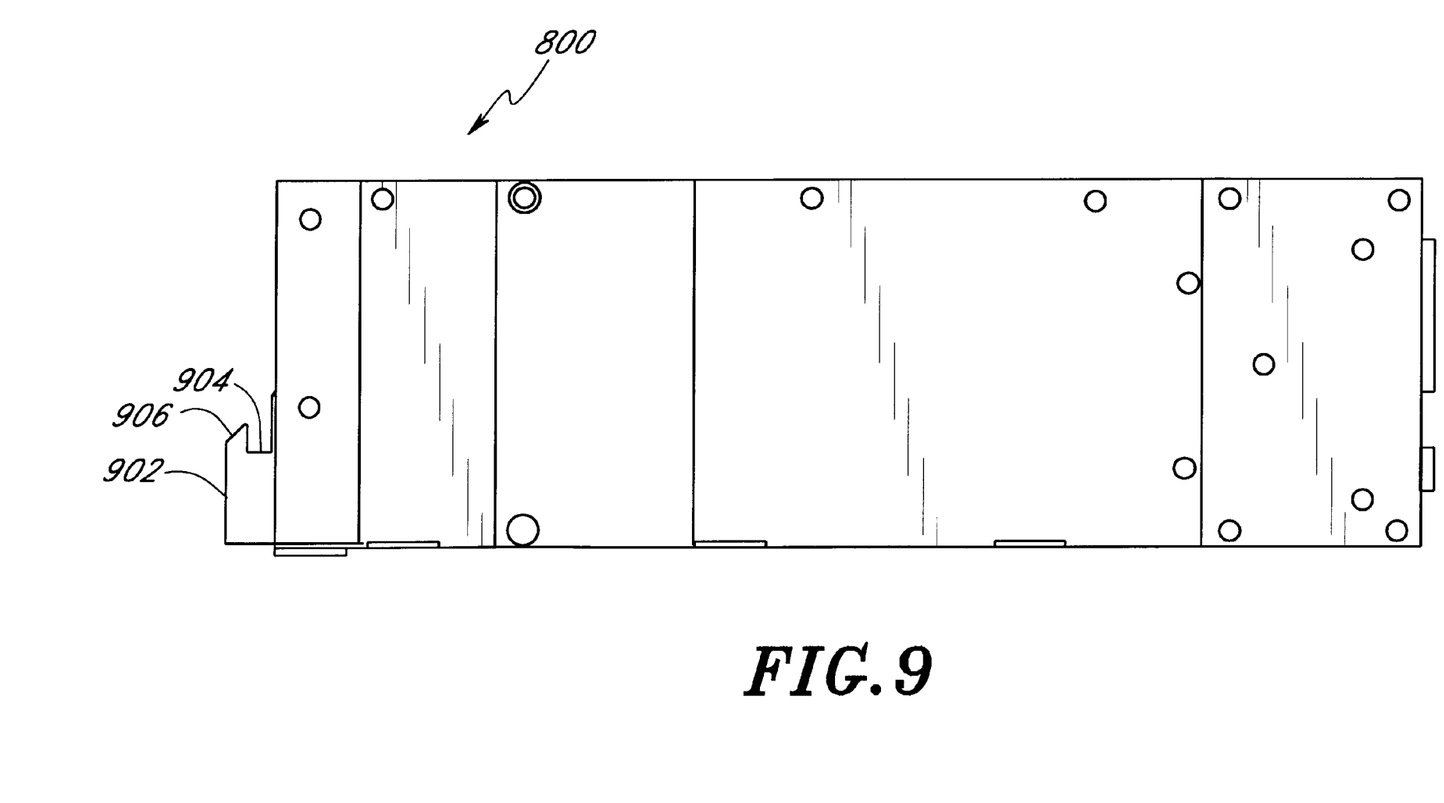
FIG. 9 is an illustration of one side of the rack illustrated in FIG. 8.

Furthermore, referring to the side view of the exemplary rack 800 as illustrated in FIG. 9, the rack 800 has a forward portion 902 corresponding to the forward portion of the power supply. The forward portion 902 contains a slot 904 for receiving the pawl finger 134 discussed above. Furthermore, the forward portion 902 of the rack 800 has a portion 906 angled so as not to damage the pawl finger 134 if it has been inadvertently extended through the side panel hole 136 of the power supply 100 before insertion. Should the pawl finger 134 be extended through the side hole 136 before insertion, when the pawl finger 134 encounters the angled portion 906 of the rack 800, the pawl finger 134 is kicked up, rather than bent or damaged. The finger 134 will then drop down into the slot 904 once the power supply is fully inserted into the rack 800.

While certain preferred embodiments of the invention have been described, these embodiments have been presented by way of example only, and are not intended to limit the scope of the present invention. Accordingly, the breadth and scope of the present invention should be defined only in accordance with the following claims and their equivalents.

What is claimed is:

1. A hot-swappable power supply that electrically plugs into a rack, the power supply comprising:
   at least one circuit board;
   a housing assembly, said housing assembly having a substantially square rear side thereby allowing at least partial insertion of the power supply into the rack in at least a first, a second, a third, and a fourth orientations;
   at least a first connector accessible from said rear side, said first connector having at least one pin which extends from said rear side by a first amount, said pin in electrical communication with said circuit board, said first connector adapted to couple with a connector in the rack;
   a first key assembly extending from said rear side by a second amount, said first key assembly configured to permit said power supply to be fully inserted into the rack in a first orientation; and
   a standoff assembly including at least four standoffs extending from said rear side by a third amount greater than said first amount and greater than said second amount, where the standoff assembly protects the first connector and the first key assembly when rested on the rear side, but allows the first connector and the first key assembly to couple with the connector in the rack when inserted in the first orientation, where the standoff assembly includes:
      a first standoff spaced a first distance from a first side of the housing and a second distance less than the first distance from a second side of the housing, where the second side of the housing is adjacent to the first side of the housing;
      a second standoff spaced at about the second distance from the second side of the housing and at about the second distance from a third side of the housing, where the third side of the housing is opposite to the first side of the housing;
      a third standoff spaced a third distance different than the first distance from the first side of the housing and at about the third distance from a fourth side of the housing, where the fourth side is opposite to the second side of the housing; and
      a fourth standoff positioned about the third distance from the third side of the housing and at about third distance from the fourth side of the housing.

2. The power supply as defined in claim 1, wherein said first connector has at least two staggered pins, said first connector configured to receive single phase Alternating Current (AC) power, where a first staggered pin is adapted to couple to a rack common point and a second staggered pin is adapted to couple to a polarity line, where the first staggered pin extends from the rear side of the power supply by a distance greater than the second staggered pin such that the common point is connected prior to the polarity line upon insertion of the power supply into the rack in the first orientation.

3. The power supply as defined in claim 1, further comprising:
   a precharge pin located on said first connector; and
   a first Alternating Current (AC) polarity pin shorter than said precharge pin.

4. The power supply as defined in claim 1, wherein said first key assembly is spaced a fourth distance from the first side of said housing assembly and is spaced a fifth distance from the fourth side of said housing assembly such that the first key assembly does not strike with a rack connector that mates with the first connector when the power supply is inserted into the rack in an orientation selected from the group consisting of the second orientation, the third orientation, and the fourth orientation.

5. The power supply as defined in claim 1, further comprising:
   a second connector having at least one pin spaced from the at least one pin of said first connector by approximately 1 inch; and
   a second key assembly located in proximity to said second connector.

6. The power supply as defined in claim 1, further comprising a second key assembly positioned no closer than approximately 1.45 inches from said first key assembly.

7. The power supply as defined in claim 1, further comprising a control signal connector positioned at least approximately 1.8 inches from the fourth side and approximately 2.2 inches from the third side of said housing, said control signal connector having at least two staggered pins.

8. The power supply as defined in claim 1, further comprising:
   a second connector having a pin spaced from at least one first connector pin by at least approximately 1.35 inches; and
   a second key assembly located in proximity with said second connector.

9. The power supply as defined in claim 1, further comprising at least two current sharing enable pins.

10. A hot-swappable power supply adapted to plug into a rack, comprising:
    a power supply housing assembly having at least a first side having a center and at least a first edge, wherein said first side is substantially square;
    a connector located on said first side, said connector having a first set of pins;
    at least a first key extending from said first side of said power supply housing assembly, wherein said first key is positioned a first distance from said center of said first side and a second distance greater than the first distance from said first edge of said first side such that the first key does not strike a connector when the power supply is inserted into the rack in an incorrect orientation.

11. The power supply as defined in claim 10 wherein said first set of pins includes at least two pins of different lengths.

12. The power supply as defined in claim 10, wherein said first set of pins includes at least two signal pins electrically connected together.

13. The power supply as defined in claim 10, wherein said at least first key is located on said connector.

14. The power supply as defined in claim 10, further comprising at least a first support structure extending further from said first side than said at least first key.

15. The power supply as defined in claim 10, further comprising an Alternating Current (AC) input connector, and a Direct Current (DC) output connector, wherein said first connector is a signal connector positioned between said AC input connector and said DC output connector.

16. The power supply as defined in claim 10, further comprising at least two output voltage control pins.

17. A power system comprising:
   a power supply having at least a first set of pins and at least a first key extending from a first side of said power supply, where the first side is substantially square; and
   a rack configured to receive at least two of said power supplies substantially side by side, said rack having a first mating area for receiving said first set of pins and a second mating area for receiving said first key, said second mating area positioned so that said power supply can only be fully inserted in a first orientation, and said first mating area positioned so that said first key will not strike said first mating area if said power supply is inserted in an orientation selected from the group consisting of a second orientation, a third orientation, and a fourth orientation, where the first, the second, the third, and the fourth orientations are displaced by approximately 90 degrees.

18. The power system as defined in claim 17, further comprising a latch used to latch said power supply into said rack.

19. The power system as defined in claim 17, further comprising a low friction material applied to at least a portion of said rack to ease the insertion of power supplies into said rack.

20. The power system as defined in claim 17, wherein at least a portion of said power supply is approximately 5 inches wide, and at least a first portion of said rack is approximately 19 inches wide.

21. A method of protecting components in a system in a hot-swappable power supply, the method comprising:
   (a) permitting at least partial insertion of a rear side of the power supply into a rack in a first, a second, a third, and a fourth orientations that vary from each other by about 90 degrees;
   (b) keying the power supply with at least one key to prevent complete insertion of the power supply in an orientation other than the first orientation;
   (c) locating the at least one key such that the key does not strike a connector in the rack when the power supply is inserted in an orientation other than the first orientation;
   (d) gradually inserting the power supply in the first orientation, where the at least one key permits complete insertion in the first orientation;
   (e) connecting to an alternating current (AC) power source by:
      (i) connecting to an AC common through a first pin in a first blind mating connector;
      (ii) connecting to at least one phase of the AC power source through a second pin in the first blind mating connector after the connecting to the AC common, where the second pin pre-charges an EMI filter to limit an inrush current; and
      (iii) connecting to the at least one phase of the AC power source through a third pin in the first blind mating connector after connecting with the second pin;
   (f) connecting to a direct current (DC) power bus by:
      (i) connecting to a ground through a first pin in a second blind mating connector; and
      (ii) connecting to a voltage line through a second pin in the second blind mating connector.

22. The method as defined in claim 21 further comprising connecting a third blind mating connector to receive current sharing signals.

23. A hot-swappable power supply comprising:
   means for permitting at least partial insertion of a rear side of the power supply into a rack in a first, a second, a third, and a fourth orientations that vary from each other by about 90 degrees;
   means for keying the power supply with at least one key to prevent complete insertion of the power supply in an orientation other than the first orientation;
   means for locating the at least one key such that the key does not strike a connector in the rack when the power supply is inserted in an orientation other than the first orientation;
   means for gradually inserting the power supply in the first orientation, where the at least one key permits complete insertion in the first orientation;
   means for connecting to an alternating current (AC) power source by:
      means for connecting to an AC common through a first pin in a first blind mating connector;
      means for connecting to at least one phase of the AC power source through a second pin in the first blind mating connector after the connecting to the AC common, where the second pin pre-charges an EMI filter to limit an inrush current; and
      means for connecting to the at least one phase of the AC power source through a third pin in the first blind mating connector after connecting with the second pin; means for connecting to a direct current (DC) power bus by:
      means for connecting to a ground through a first pin in a second blind mating connector; and
      means for connecting to a voltage line through a second pin in the second blind mating connector.

* * * * *